United States Patent [19]

Awano

[11] Patent Number: 4,994,866
[45] Date of Patent: Feb. 19, 1991

[54] COMPLEMENTARY SEMICONDUCTOR DEVICE

[75] Inventor: Yuji Awano, Tokyo, Japan

[73] Assignee: Fujitsu Limited, Kawasaki, Japan

[21] Appl. No.: 293,527

[22] Filed: Jan. 5, 1989

[30] Foreign Application Priority Data

Jan. 7, 1988 [JP] Japan ................................ 63-000742
Jul. 28, 1988 [JP] Japan ................................ 63-188908

[51] Int. Cl.$^5$ .................. H01L 29/161; H01L 29/80; H01L 27/02; H01L 29/78
[52] U.S. Cl. ........................................ 357/16; 357/22; 357/42; 357/61; 357/23.12
[58] Field of Search ................ 357/16, 42, 61, 23.12

[56] References Cited

U.S. PATENT DOCUMENTS 4,013,979  3/1977  Vittoz ................................. 357/42
4,710,788 12/1987  Dämbkes et al. ................... 357/16
4,729,000  3/1988  Abrokwah .......................... 357/16

Primary Examiner—Rolf Hille
Assistant Examiner—Wael Fahmy
Attorney, Agent, or Firm—Staas & Halsey

[57] ABSTRACT

A complementary semiconductor device (CMOS gate) including a p-channel transistor (PMOS FET) and an n-channel transistor (NMOS FET). A silicon substrate, a channel layer for the p-channel transistor which comprises a first $Si_{1-x}Ge_x$ layer, a Ge layer, and a second $Si_{1-x}Ge_x$ layer are formed in sequence on the silicon substrate. A silicon layer, as another channel layer for the n-channel transistor, is formed on the channel layer. The ratio "x" of the first $Si_{1-x}Ge_x$ layer is continuously increased from 0 to 1, and the ratio "x" of the second $Si_{1-x}Ge_x$ layer is continuously decreased from 1 to 0.

12 Claims, 7 Drawing Sheets $V_{GS} \leq V_{TP}$ $V_{GS} \geq V_{TN}$

COMPLEMENTARY SEMICONDUCTOR DEVICE

BACKGROUND OF THE INVENTION

1. Field of the Invention

The present invention relates to a semiconductor device, and more particularly, to a complementary metal oxide semiconductor field effect transistor (CMOS FET).

2. Description of the Related Art

A CMOS device generally consists of an n-channel transistor (i.e., NMOS FET) utilizing electron carriers and a p-channel transistor (i.e., PMOS FET utilizing hole carriers, which transistors are interconnected, as shown in FIG. 1, to form a basic gate of a logic circuit. The CMOS gate has advantages such as low power consumption, high degree of integration, large noise margin, and large fan-out and is used in a highly integrated memory device such as a silicon DRAM.

Usually, a silicon (Si) semiconductor is used as the material for the CMOS device, as the electron mobility $\mu_e$ in Si is approximately 1500 cm$^2$/V.sec, and the hole mobility $\mu_h$ is approximately 450 cm$^2$/V.sec, which is one third of the electron mobility. Accordingly, the switching speed of the PMOS FET is slower than that of the NMOS FET, and thus restricts the switching speed of the CMOS device as a whole. Furthermore, to bring the current driving capability of the PMOS FET to the same level as that of the NMOS FET, the gate width of the PMOS FET must be made twice or three times as large as that of the NMOS FET because of the difference of carrier mobility, so that the area occupied by or the size of the PMOS FET is increased, and this limits an increase of the density of an integrated circuit using CMOS gates. Therefore, to increase the current driving capability and the switching speed of the CMOS gate, the switching speed of the PMOS FET must be increased; namely, a PMOS FET having an increased hole mobility must be provided.

Among known semiconductor materials, Ge and InSb have a high hole mobility. The electron mobility $\mu_e$ and hole mobility $\mu_h$ of Ge and InSb at a room temperature are shown in the following table.

| Semiconductor Material | Electron Mobility cm$^2$/V · sec | Hole Mobility cm$^2$/V · sec |
|---|---|---|
| Ge | 3900 | 1900 |
| InSb | 80000 | 1250 |

InSb has a narrow forbidden band (energy gap) of 0.17 eV and it is difficult to produce an element operating at a room temperature by using InSb. Research has been made into the production of a p-channel transistor (PMOS FET) using Ge, but a good quality and stable oxide layer can not be formed on Ge. Therefore, although a Ge p-channel transistor can be produced (e.g., cf. JP-A (Kokai)-No. 58-61675 and JP-A-No. 62-54459) it can not be used in practice due to a large surface leakage current thereof, and further, it is difficult to carry out a surface treatment of Ge.

Crystal growth technology has made tremendous progress recently; for example, using a molecular beam epitaxy (MBE) method, a Si$_{1-x}$Ge$_x$ mixed crystal can be grown on silicon (for example, cf. T. P. Pearsall et al., 1st Int. Symp. on Si MBE, 1985; H. Daembkes et al., IEDM. 1985; and T. Sakamoto, Researches of the Electrotechnical Laboratory, No. 875, Dec. 1986, pp. 112-121).

A p-channel transistor using a two-dimensional hole gas generated at an interface of a heterojunction of Si and Si$_{1-x}$Ge, has been proposed (T. P. Pearsall et al., IEEE Electron Device Letters, Vol. EDL-7, No. 5, May 1986, pp. 308-310). This proposed transistor comprises, as shown in FIG. 2, a p-silicon (Si) substrate 51, an i-Ge$_{0.2}$Si$_{0.8}$ layer 52 formed on the Si substrate, a p-Si layer 53 formed on the GeSi layer 52, an insulating (SiO$_2$) layer 54, p$^+$-doped regions (source region 55 and drain region 56), a source electrode 57, a drain electrode 58, and a gate electrode 59. In this case, only the Si layer 53 is doped with p-type impurities (i.e., a modulation doping technique is adopted), the two-dimensional hole gas is generated in the GeSi layer 52 by feeding holes (carriers) from the Si layer 53 to the GeSi layer 52, and is controlled by a gate voltage applied to the gate electrode 59. The proposed transistor (FIG. 2) is a p-channel MODFET (Modulation Doped field-effect transistor) in which the Si layer 53 is doped with a large quantity of p-type impurities, and therefore, when an n-channel transistor must be formed together with the p-channel transistor for a complementary FET, a substrate structure suitable for the formation of the n-channel transistor must be first formed, a portion of the substrate removed by selective etching, and the Ge$_{0.2}$Si$_{0.8}$ layer and the Si layer of FIG. 2 then a region newly developed to replace the rem portion. Namely, in this case, a semiconductor region for the n-channel transistor and another semiconductor region for the p-channel transistor must be formed (epitaxially grown), and therefore, the production process for the complementary FET becomes complicated.

SUMMARY OF THE INVENTION

An object of the present invention is to provide a CMOS device in which the PMOS FET operates at an increased switching speed.

Another object of the present invention is to provide a CMOS device which is provided by a simplified process.

The above-mentioned and other objects of the present invention are obtained by providing a complementary semiconductor device including a p-channel transistor and an n-channel transistor, the device comprising: a silicon substrate; a first channel layer for the p-channel transistor which comprises a first Si layer, a Ge layer, and a second Si$_{1-y}$Ge$_y$ layer formed in sequence on the silicon substrate; and a silicon layer, as another, or second, channel layer for the n-channel transistor, formed on the first channel layer.

According to the present invention, the hole mobility (1900 cm$^2$/V.sec) of the p-channel transistor at the Ge layer of the channel layer is larger than the electron mobility (1500 cm$^2$/V.sec) of the n-channel transistor at the Si channel layer, and accordingly the switching speed of the complementary semiconductor (CMOS) device depends on that of the n-channel transistor, and thus is much faster than that of a conventional silicon complementary semiconductor (CMOS) device. Since the Ge layer of the channel layer of the p-channel transistor is sandwiched between the SiGe layer, and between the Si substrate and the Si layer, and is not exposed, no surface leakage current occurs. Furthermore, the top semiconductor layer of the device is the Si layer, and a good quality and stable insulating oxide (SiO$_2$) layer can be easily formed on the Si layer by a conventional process. Preferably, the ratio "x" of the first and second $Si_{1-x}Ge_x$ layers is continuously varied within the range of 0 to 1 or 1 to 0, respectively, to relax any strain stress caused by lattice mismatching between the Si and Ge.

The Ge layer consists essentially of 90% to 100% Ge and the rest Si. Preferably, the Ge layer consists of 100% Ge, since the larger the Ge content of the Ge layer, the greater the hole mobility thereof.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 3A:
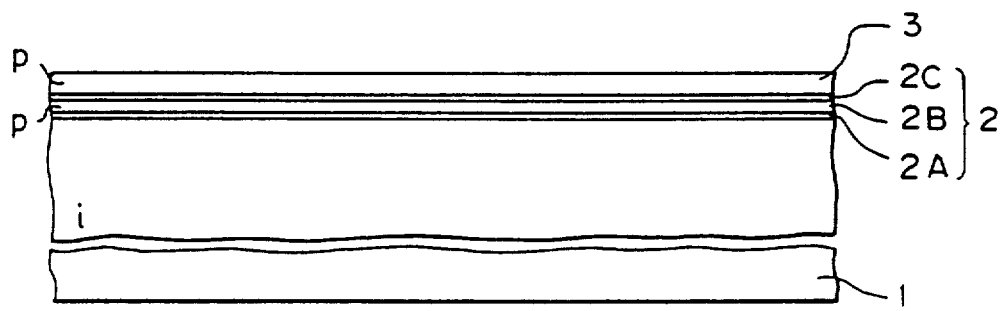
FIG. 3A to FIG. 3G are schematic sectional views of a CMOS gate according to the present invention in various stages of production.
Figure 3B:
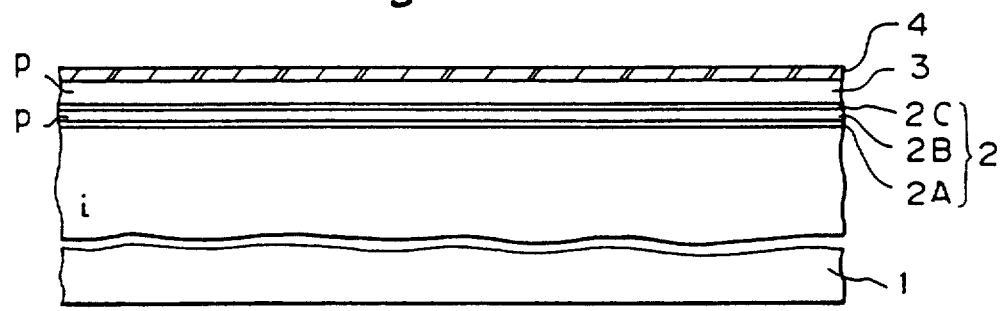
Figure 3C:
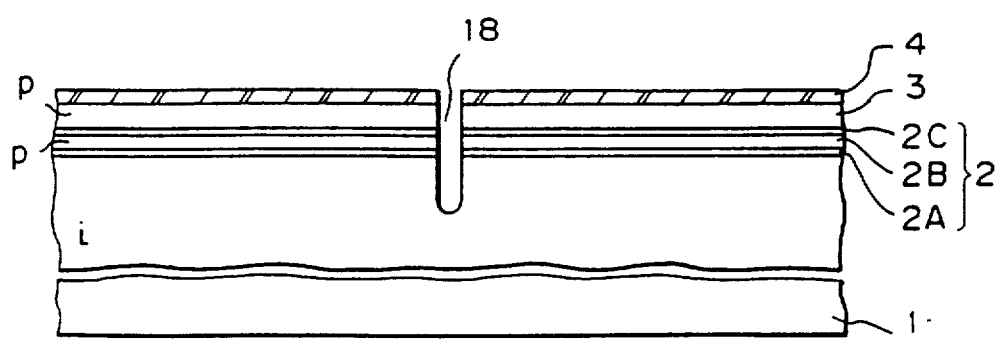
Figure 3D:
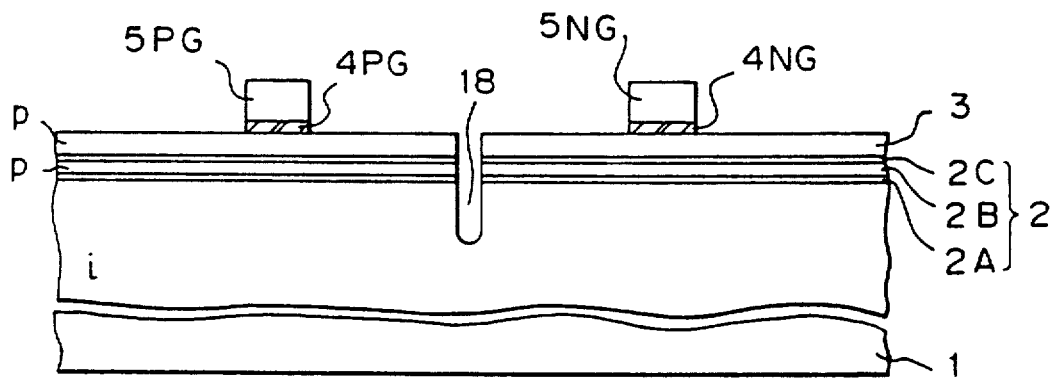
Figure 3E:
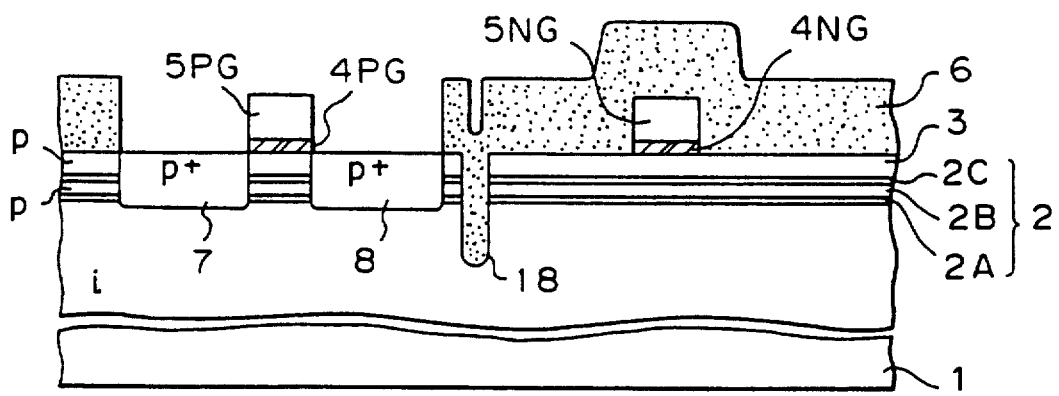
Figure 3F:
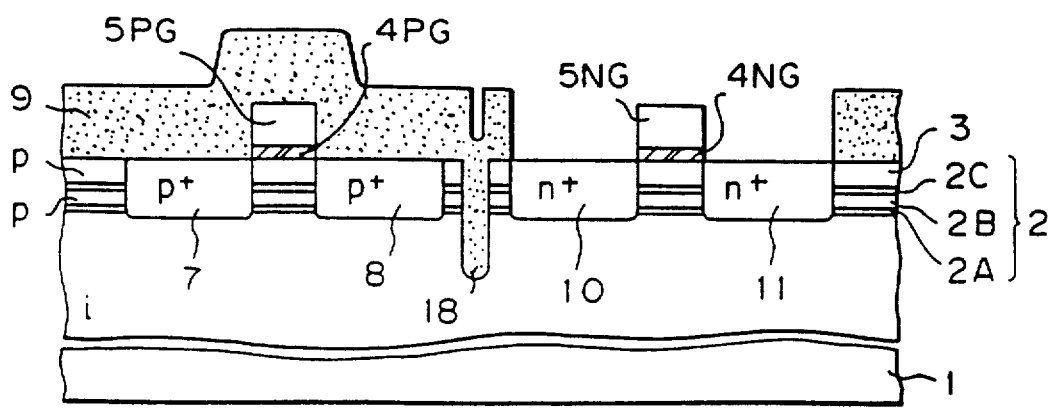
Figure 3G:
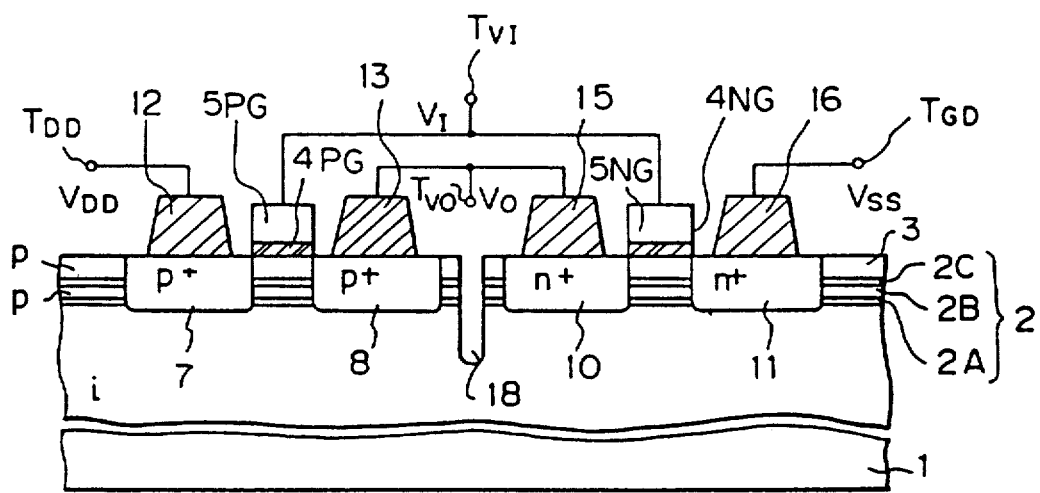

Referring to FIG. 3G, a CMOS inverter gate according to the first embodiment of the present invention consists of a PMOS FET and an NMOS FET and comprises an i-type (or p-type) Si substrate 1, a channel layer 2 consisting of a first p-type (or i-type) $Si_{1-x}Ge_x$ layer 2A, a Ge layer 2B, and a second p-type (or i-type) $Si_{1-x}Ge_x$ layer 2C for the PMOS FET, and another channel layer (i.e., p-type Si layer) 3 for the NMOS FET. The PMOS FET comprises a gate insulating layer 4PG, a gate electrode 5PG, a p-type source region 7, a p+-type drain region 8 a source electrode 12, and a drain electrode 13. The NMOS FET comprises a gate insulating layer 4NG, a gate electrode 5PG, an n+-type drain region 10, an n+-type source region 11, a drain electrode 15 and a source electrode 16. The PMOS FET and the NMOS FET are isolated from each other by a groove 18. The electrode 5PG, 5NG, 12, 13, 15, and 16 are interconnected, as shown in FIG. 3G to form the CMOS gate circuit shown in FIG. 1.

The CMOS gate circuit is produced in the following manner.

Figures 5A, 5B, 5C:
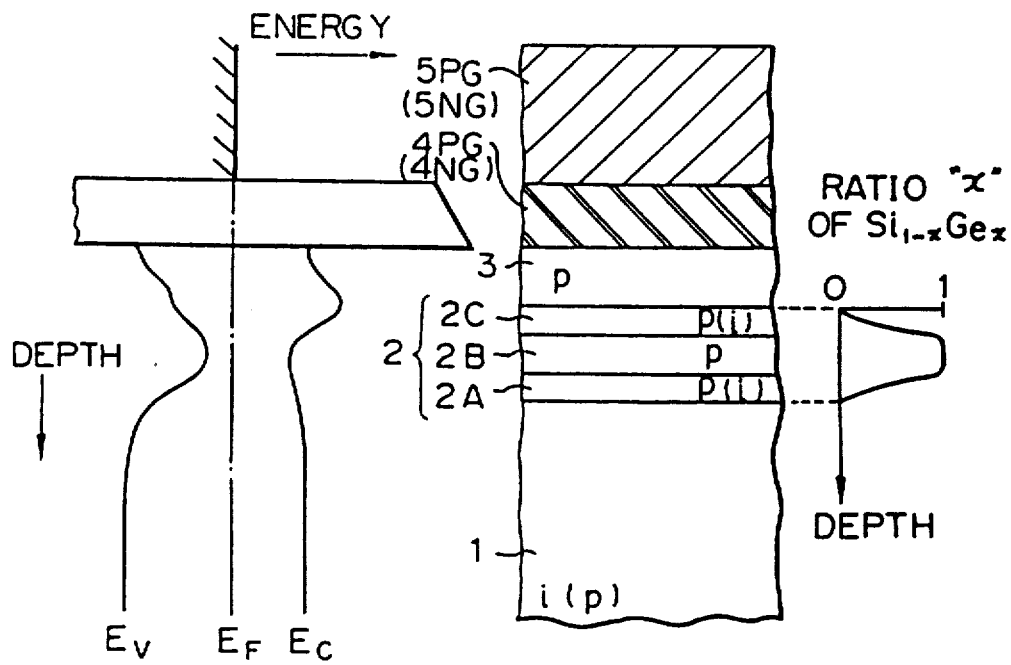
FIG. 5A is a partial sectional view of the CMOS gate according to the present invention.
FIG. 5B is a graph of the variation of the ratio "x" of a channel layer of a PMOS FET.
FIG. 5C is an energy band diagram of the CMOS gate of FIG. 5A.

As shown in FIG. 3A, the p-type SiGe layer 2A, the p-type Ge layer 2B, the p-type SiGe layer 2C, and the p-type Si layer 3 are continuously grown on the i-type Si substrate 1 by an MBE method. For example, the first $Si_{1-x}Ge_x$ layer 2A has a thickness of 5 nm and a concentration of p-type impurities (e.g., B) of $1 \times 10^{17}$ cm$^{-3}$; and the ratio "x" continuously varies (increases) from 0 to 1; the Ge layer 2B has a thickness of 10 nm and a concentration of p-type impurities (B) of $1 \times 10^{18}$ cm$^{-3}$; the second $Si_{1-x}Ge_x$ layer 2C has a thickness of 5 nm and a concentration of p-type impurities (B) of $1 \times 10^{17}$ cm$^{-3}$ and the ratio "x" continuously varies (decreases) from 1 to 0; the layers 2A, 2B, and 2C constitute the n-channel layer 2, as shown in FIG. 5A and the ratio "x" in the $Si_{1-x}Ge_x$ varies, as shown in FIG. 5B, i.e., the ratio "x" of the $Si_{1-x}Ge_x$ layers 2A and 2C is almost zero at the respective hearby portions thereof coming into contact with the Si of the substrate 1 and layer 3, and the ratio "x" is almost 1 at the respective adjacent portions of the SiGe layers 2A and 2C coming into contact with the Ge layer 2B, and therefore, this layer structure of the channel layer 2 relaxes any strain stress caused by lattice mixmatching between the Si and Ge. The Si layer 3 has a thickness of 20 nm and a concentration of p-type impurities (B) of $1 \times 10^{16}$ cm$^{-3}$.

As illustrated in FIG. 3B, a gate insulating layer 4 made of $SiO_2$ and having a thickness of, e.g., 10 nm is formed on the Si layer 3 by an Si thermal oxidation method.

As illustrated in FIG. 3C, the formed layers 4, 3, 2C, 2B, 2A, and the Si substrate 1 are selectively etched by a conventional photolithographic process and a suitable etching process, to form a U-shaped groove 18. The groove 18 extends into the Si substrate 1 and serves as an isolation region electrically separating the PMOS FET and NMOS FET from each other.

Figure 4:
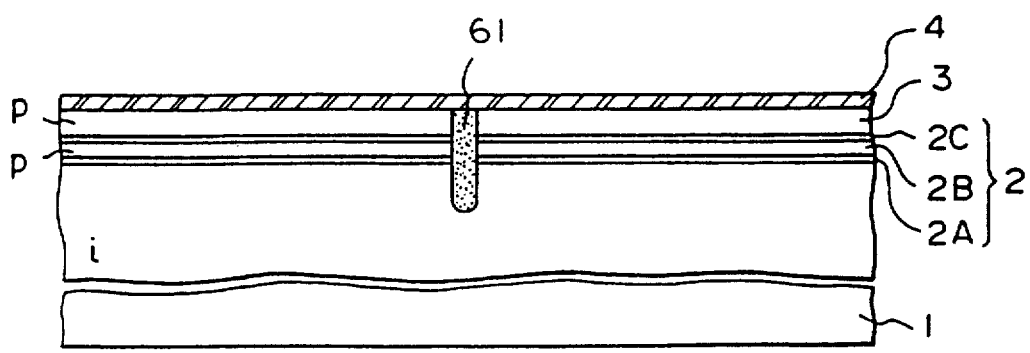
FIG. 4 is a schematic sectional view of the Si substrate with the layers formed at an isolation region formation step.

An isolation region 61 can be formed instead of the U-shaped groove 18, as shown in FIG. 4, by doping protons (H+) from the exposed surface into the Si substrate 1, by an ion-implantation technique.

As illustrated in FIG. 3D, a doped polycrystalline silicon layer having a thickness of e.g., 350 nm, is formed on the insulating layer 4 by a conventional chemical vapor deposition (CVD) process, and is selectively etched (patterned) by a conventional photolithographic process and a suitable etching process, whereby the gate electrodes 5PG and 5NG are formed. Then, using the polycrystalline silicon gate electrodes 5PG and 5NG as masks, the insulating layer 4 is selectively etched (patterned) by a suitable etching process to form the gate insulating layer 4PG and 4NG.

As illustrated in FIG. 3E, a masking layer 6 is formed over the entire surface and is patterned to expose a portion for the PMOS FET. For example, the masking layer 6 of aluminum (Al) is deposited by a vapor evaporation process or a sputtering process and is patterned by a conventional photolithographic process and a suitable etching process. In this case, preferably a protecting layer of, e.g., $SiO_2$ or $Si_3N_4$, is formed under the Al layer.

P-type impurities, e.g., boron (B), are ion-implanted into the formed layers 3, 2C, 2B, and 2A, and the Si substrate 1, not covered by the masking layer 6, to form the p+-type drain region 7 and the p+-type source region 8.

The ion-implantation conditions are, for example, as follows:

Ion (impurity) source: $BF_2$
Dose: $1 \times 10^{15}$ cm$^{-2}$
Implanting energy (Acceleration voltage): 50 keV In this case, the ions can not pass through the gate electrode 5PG, and thus the portion of the Si layer 3 covered by the gate layer 5PG is not doped. Since the Ge layer 2B serves as a channel layer of the PMOS FET, the impurity ions must be allowed to pass through the Ge layer 2B, to sandwich the portion of the Ge layer 2B below the gate layer 5PG between the p+-type regions 7 and 8.

After the masking layer 6 is removed, the implanted regions 7 and 8 are subjected to a laser annealing process, to activate the implanted impurities and recover crystal defects.

As illustrated in FIG. 3F, another masking layer 9 is formed over the entire surface and is patterned to expose a portion for the NMOS FET. For example, the masking layer 9 of Al is deposited by a vapor evaporation process or a sputtering process and is patterned by a conventional photolithographic process and a suitable etching process. Preferably, a protecting layer of SiO or $Si_3N_4$ is formed under the Al layer.

N-type impurities, e.g., arsenic (As), are ion-implanted into the formed layers 3, 2C, 2B, and 2A, and the Si substrate 1 not covered by the masking layer 9, to form the n+-type drain region 10 and the n+-type source region 11.

The ion-implantation conditions are for example, as follows:

1 ion (impurity) source: As
Dose: $1 \times 10^{16} cm^{-2}$
Implanting energy: 120 keV In this case, the gate electrode 4NG prevents passage of the As ions therethrough and thus the portion of the Si layer 3 covered therewith is not doped. Since the Si layer 3 serves as a channel layer of the NMOS FET, at least the As ions must be allowed to pass through the Si layer 3, to sandwich the portion of the Si layer 3 below the gate electrode 4PG between the n+-type regions 10 and 11.

After the masking layer 9 is removed, the implanted regions 10 and 11 are subjected to a laser annealing process, to activate the implanted impurities.

A resist can be used as the masking layer material, instead of the Al masking layer. Furthermore, the laser annealing process can be replaced by an annealing with a suitable heating means.

Figure 1:
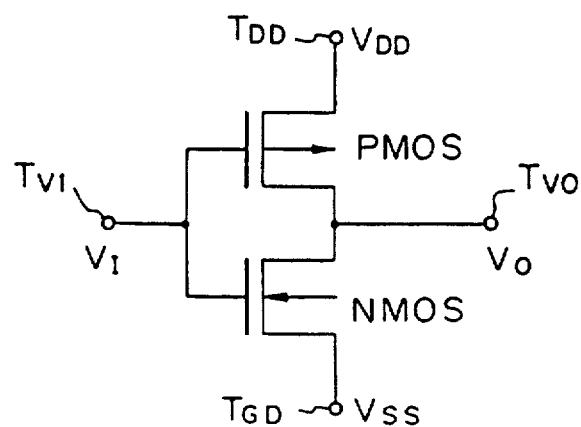
FIG. 1 is a circuit diagram of a CMOS inverter gate.
Figure 2:
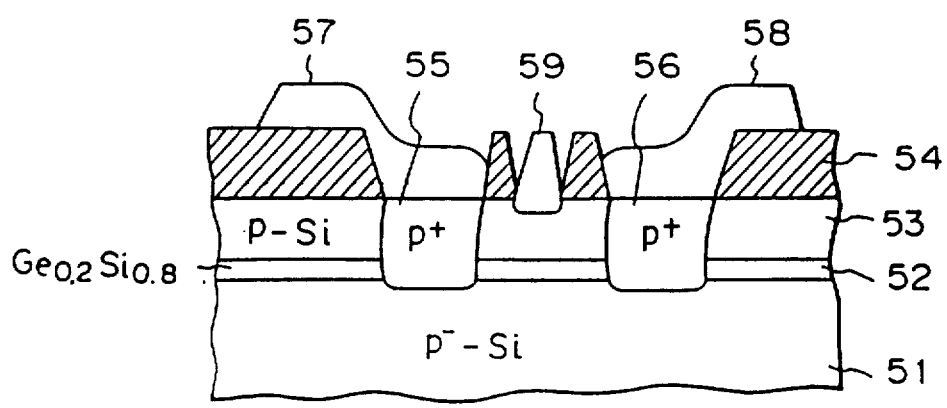
FIG. 2 is a schematic sectional view of a p-channel MODFET.

As illustrated in FIG. 3G, a metal layer, e.g., Al, having a thickness of 400 nm is deposited over the entire surface by a vapor evaporation process or a sputtering process, and is patterned to form the drain electrode 12, the source electrode 13, the drain electrode 15, and the source electrode 16, by a conventional photolithographic process and a suitable etching process. The drain electrodes 13 and 14 are interconnected, the gate electrodes 5PG and 5NG are interconnected, and the electrodes 12, 13, 15, and 16 are connected to terminals $T_{DD}$, $T_{VI}$, $T_{V0}$ and $T_{GD}$, as shown in FIG. 1, to complete the CMOS inverter gate.

In the produced CMOS gate circuit, an input voltage $V_I$ is commonly applied to the gate electrodes 5PG and 5NG of the PMOS FET and NMOS FET, an output voltage $V_0$ is commonly obtained from the drain electrodes 13 and 15, a positive supply voltage $V_{DD}$ is applied to the source electrode 12 of the PMOS FET, and a ground voltage $V_{SS}$ is applied to the source electrode 16 of the NMOS FET.

The energy band diagrams and the operations of the PMOS FET and NMOS FET are explained below with reference to FIGS. 5A, 5B, and 5C, 6A and 6B, and 7.

FIG. 5A is a partial sectional view of the CMOS gate at the gate electrode 5PG (or 5NG), and FIG. 5B is a graph indicating the variation of the ratio "x" of $Si_{1-x}Ge$ for the channel layer 2 consisting of the $Si_{1-x}Ge$ layers 2A and 2C and Ge layer 2B. FIG. 5C is an energy band diagram of the CMOS gate shown in FIG. 5A, under the conditions that the gate voltage is zero and a channel is not generated in the n-channel layer 2 (especially, the Ge layer 2B) and the p-channel layer (Si layer) 3.

Figure 6A:
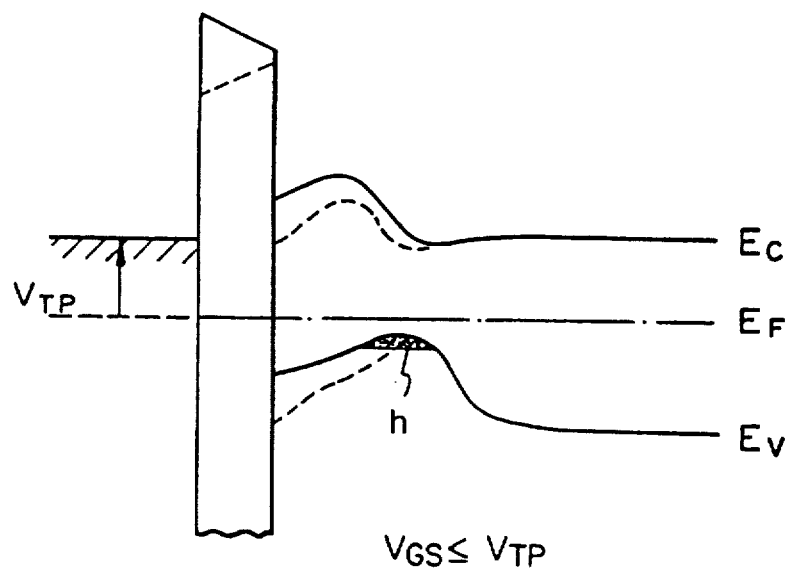
FIG. 6A is an energy band diagram of a PMOS FET.

When a gate voltage (i.e., gate-source voltage $V_{GS}$ smaller than or equal to the threshold voltage $V_{TP}$ thereof, is applied the gate electrode 5PG of the PMOS FET, an energy band diagram shown in FIG. 6A is obtained and hole carriers "h" are generated in the channel layer 2, especially the Ge layer 2B, and the PMOS FET is turned ON.

Figure 6B:
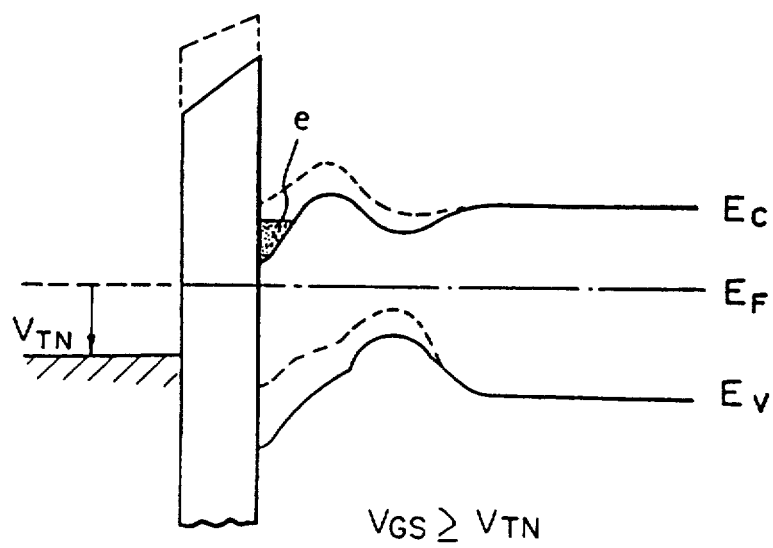
FIG. 6B is an energy band diagram of an NMOS FET.

When a gate voltage (i.e., gate-source voltage $V_{GS}$) larger than or equal to the threshold voltage $V_{TN}$ thereof is applied to the gate electrode 5NG of the NMOS FET, another energy band diagram shown in FIG. 6B is obtained and electron carriers "e" are generated in the Si layer 3 at the interface of the Si layer 3 and the gate insulating layer 4, and the NMOS FET is turned ON.

Figure 7:
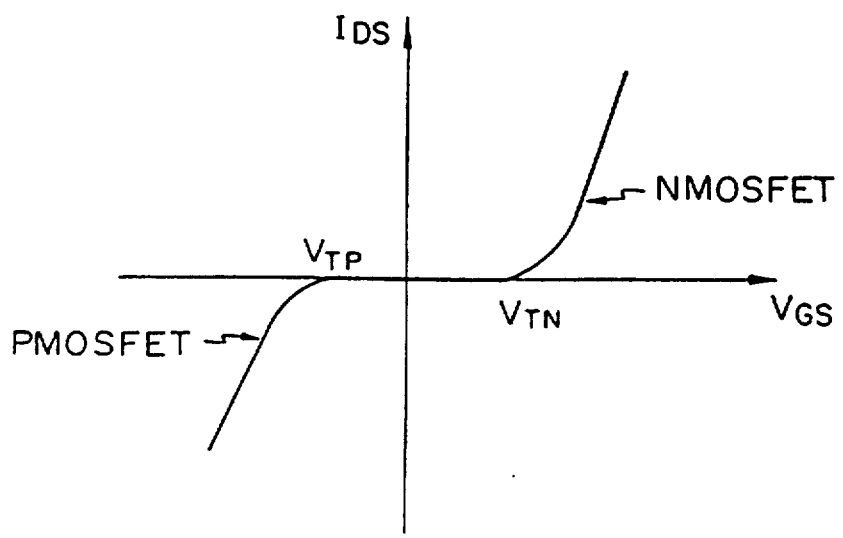
FIG. 7 is a graph showing a relationship between the gate-source volta $V_{GS}$ and a drain-source current $I_{DS}$.

FIG. 7 is a graph showing a relationship between the gate-source voltage $V_{GS}$ and a drain-source current $I_{DS}$. As shown in FIG. 7, when the gate-source voltage $V_{GS}$ is positively increased and exceeds the threshold voltage $V_{TN}$, the NMOS FET is turned ON, and when the gate-source voltage $V_{GS}$ is negatively increased and exceeds the threshold voltage $V_{TP}$, the PMOS FET is turned ON.

Figure 8A:
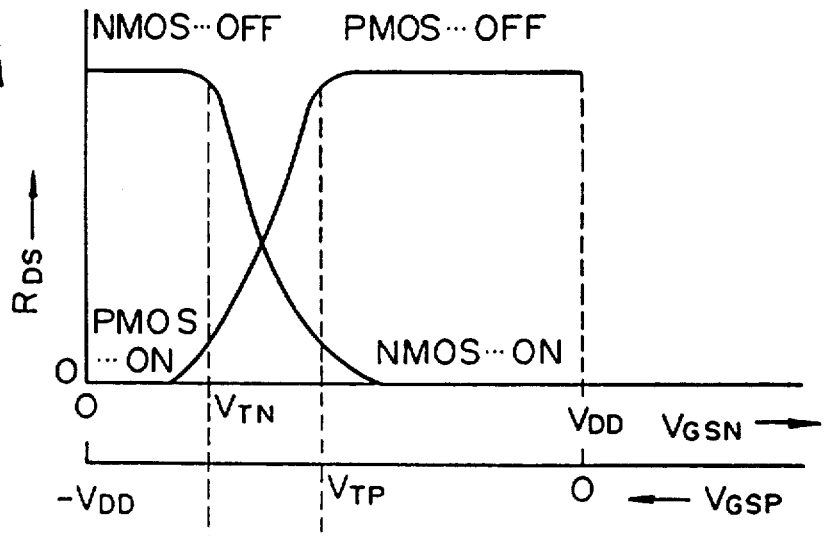
FIG. 8A is a graph showing a relationship between the source-drain resistance $R_{DS}$ and the gate-source voltage $V_{GSP}$ or $V_{GSN}$; and, FIG. 8B is a graph showing a relationship between the output voltage $V_O$ and the input voltage $V_I$ of the CMOS gate.
Figure 8B:
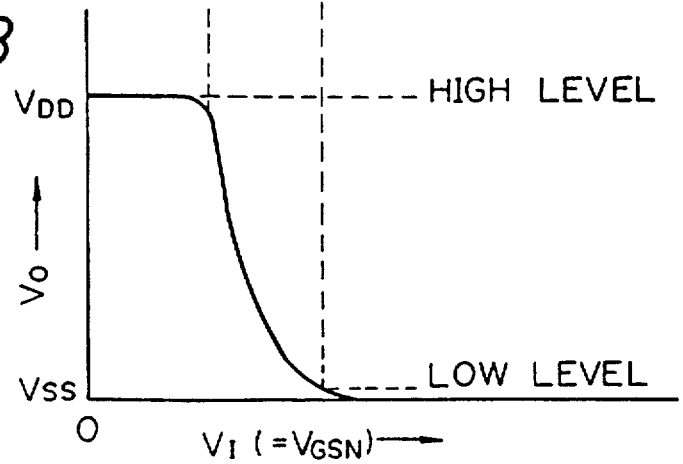

FIGS. 8A and 8B show the operation of the CMOS gate (invention), wherein FIG. 8A is a graph showing a relationship between the source-drain resistance $R_{DS}$ and the gate-source voltage $V_{GSP}$ (or $V_{GSN}$) of each of the PMOS FET and NMOS FET, and FIG. 8B is a graph showing a relationship between the output voltage $V_0$ of the CMOS gate and the $V_{GS}$. When the input voltage $V_I$ is equal to zero, the NMOS FET is turned OFF and the PMOS FET is turned ON (the gate-source potential of the p-channel, than $V_{TP}$), and thus the $-V_{DD}$, is more negative than $V_{TP}$), and thus the output voltage $V_0$ is $V_{DD}$ (high level). When the $V_I$ is raised above zero, the NMOS FET is turned ON, and the PMOS FET is turned OFF. When $V_I$ is larger than $(V_{DD}-|V_{TP}|)$, then $V_0$ is $V_{SS}$ (e.g., zero, low level). Therefore, the basic amplitude of the CMOS gate, namely, the variation value of the input voltage $V_I$ (i.e., $V_{GS}$) for changing the output voltage $V_0$ from the high level (e.g., $V_{DD}$) to the low level (e.g., zero volt), or vice versa, is the difference between the $V_{TN}$ and $V_{TP}$.

As mentioned above, since the channel layer 2 of the PMOS FET comprises the Ge layer 2B, the hole mobility $\mu_h$ in the channel layer 2 is faster than the electron mobility $\mu_e$ in the Si layer (channel layer) 3 of the NMOS FET, and therefore, the switching speed of the CMOS gate (device) depends on the switching speed of the NMOS FET and is remarkably faster than that of a conventional CMOS gate made of Si only. Moreover the Ge layer 2B and the $Si_{1-x}Ge_x$ layer 2C are completely covered by the Si layer.

Since formed consecutively in the same epitaxial growth apparatus (MBE apparatus), the Ge layer and SiGe layer are not exposed to the air, and therefore, no surface leakage current of the channel layer of the PMOS FET occurs. Furthermore, since the top semiconductor layer is the Si layer, a good quality and stable oxide layer can be easily formed on the Si layer by a conventional process.

Note, since the Ge has the electron mobility of 3900 cm$^2$/V.sec, it is possible for the Ge to be used as a channel layer of an NMOS FET (n-channel transistor) and the Ge channel layer is covered with a Si layer. In this case, however, the production process of a CMOS gate becomes complicated and other technical problems arise. Currently, the structure of the CMOS device in accordance with the present invention is preferable.

The p-type Ge layer and p-type Si layer are used in the above-mentioned CMOS device (gate) according to the first embodiment of the present invention. To improve (enlarge) the logical amplitude of the CMOS device, the Ge layer for the p-channel layer of the PMOS FET and the Si layer for the n-channel layer of the NMOS FET are given an intrinsic conductivity (i-type), i.e., the layers do not contain p-type impurities, in accordance with a second embodiment of the present invention. In this case, the Si substrate, and the first and second $Si_{1-x}Ge_x$ layers are also i-type.

The structure of the CMOS gate (device) of the second embodiment is the same as that of the above-mentioned CMOS gate, except that the first $Si_{1-x}Ge_x$ layer 2A, Ge layer 2B, second $Si_{1-x/Ge_x}$ layer 2C and Si layer 3 have an i-type conductivity. The CMOS gate of the second embodiment is produced in the same manner as explained for the production process of the CMOS gate, except that doping of the p-type impurities is not carried out during the MBE growth of the layers 2A, 2B, 2C, and 3. Preferably, the thickness of the second $Si_{1-x}Ge_x$ layer 2C is made relatively thin (i.e., to make the curve of the valence band Ev of the second SiGe layer steep), to form a barrier for accumulating holes "h", as shown in FIG. 6A.

Where the p-channel layer is an i-Ge layer and the n-channel layer is an i-Si layer, the threshold voltage $V_{TP}$ of the PMOS FET is lower than that of the PMOS FET of the first embodiment, and as a result, the logic swing of the CMOS gate is enlarged, and thus the noise margin is enlarged. In this case, since the growth of the layers 2A, 2B, 2C and 3 is performed without the doping of the p-type impurities, the threshold voltages $V_{TP}$ and $V_{TN}$ of the MOS FETs are determined by the chemical composition of the layers. Therefore, the properties of the PMOS FET and NMOS FET are stably and uniformly obtained in all CMOS gates produced at the same time or in another production lot.

Furthermore, although the Ge layer 2B of the CMOS gate is made of 100% Ge, it is possible to adopt a $Si_{1-x}Ge_x$ layer ($0.9 < X < 1.0$) instead of the Ge layer. In this case, the Ge contents of the first and second $Si_{1-x}Ge_x$ layers 2A and 2C varies between zero and a predetermined value equal to that of the $Si_{1-x}Ge_x$ layer 2B. Where the ratio "x" is smaller than 0.9, the hole mobility of the SiGe layer becomes lower than the electron mobility of the Si layer.

It will be obvious that the present invention is not restricted to the above-mentioned embodiments and that many variations are possible for persons skilled in the art without departing from the scope of the invention. For example, the complementary semiconductor device according to the present invention can be used in a logic circuit, such as NAND, NOR and the like.

What is claimed is:

1. A complementary semiconductor device including a p-channel transistor and an n-channel transistor comprising:

a silicon substrate;
   a channel layer for the p-channel transistor comprising a first $Si_{1-x}Ge_x$ layer, a Ge layer, and a second $Si_{1-x}Ge_x$ layer formed in sequence on said silicon substrate; and
   another channel layer for the n-channel transistor comprising a silicon layer formed on said channel layer.

2. A complementary semiconductor device according to claim 1, wherein the ratio "x" of said first $Si_{1-x}Ge_x$ layer continuously varies from 0 to 1.

3. a complementary semiconductor device according to claim 1, wherein the ratio "x" of said second $Si_{1-x}Ge_x$ layer continuously varies from 1 to 0.

4. A complementary semiconductor device according to claim 1, wherein said Ge layer consists of from 90% to 100% Ge and the rest Si.

5. A complementary semiconductor device according to claim 1, wherein said silicon substrate is i-type or p-type, said Ge layer is p-type, and said silicon layer is p-type.

6. A complementary semiconductor device according to claim 5, wherein each of said first and second SiGe layers is p-type or i-type.

7. A complementary semiconductor device according to claim 1, wherein each of said silicon substrate, said first SiGe layer, said Ge layer, said second SiGe layer, and said silicon layer is i-type.

8. A complementary semiconductor device according to claim 1, wherein:

said p-channel transistor comprises a source region and a drain region, each thereof formed by doping p-type impurities into said silicon substrate through the silicon layer and the channel layer;
   said n-channel transistor comprises another source region and another drain region, each thereof formed by doping n-type impurities into said channel layer through the silicon layer; and
   said device further comprises an isolation region isolating said p-channel transistor and said n-channel transistor from each other and extending to said silicon substrate through said silicon layer and said channel layer.

9. A complementary semiconductor device according to claim 8, wherein said p-channel transistor further comprises:

a gate insulating layer formed on said silicon layer between said source and drain regions of said p-channel transistor; and
   source and drain electrodes respectively in contact with said source and drain regions.

10. A complementary semiconductor device according to claim 8, wherein said n-channel transistor further comprises:

a gate insulating layer formed on said silicon layer between said another source and drain regions of said n-channel transistor; and
    source and drain electrodes respectively in contact with said another source and drain regions.

11. A complementary semiconductor device according to claim 1 forming a CMOS inverter gate.

12. A complementary semiconductor device including a p-channel transistor and an n-channel transistor comprising:

a silicon substrate having a main surface with a first region and a second region defined at said main surface thereof;

a channel layer for the p-channel transistor comprising a first $Si_{1-x}Ge_x$ layer, a Ge layer, and a second $Si_{1-x}Ge_x$ layer formed in sequence on said first and second regions;

another channel layer for the n-channel transistor comprising a silicon layer formed on said channel layer formed over said first and second regions;

a first gate insulating layer and a first gate electrode formed on said silicon layer above said first region, for the p-channel transistor; and a second gate insulating layer and a second gate electrode formed on said silicon layer above said second region, for the n-channel transistor.

* * * * *

UNITED STATES PATENT AND TRADEMARK OFFICE
CERTIFICATE OF CORRECTION

PATENT NO. : 4,994,866
DATED : February 19, 1991
INVENTOR(S) : AWANO

It is certified that error appears in the above-identified patent and that said Letters Patent is hereby corrected as shown below:

Col. 2, line 48, change "Si" to --$Si_{1-x}Ge_x$--.

Col. 3, line 38, delete ",".

Col. 4, line 20, change "mixmatching" to --mismatching--.

Col. 6, lines 3 and 4, change "Ge" to --$Ge_x$--.

Col. 7, line 25, change "$Si_{1-xI\ Gex}$" to --$Si_{1-x}Ge_x$--;
line 54, change "$Si_{1-x}Ge_x$" to --Ge--.

Col. 8, line 12, change "a" to --A--.

Signed and Sealed this

Sixth Day of July, 1993

Attest:

MICHAEL K. KIRK

Attesting Officer

Acting Commissioner of Patents and Trademarks